(12) United States Patent
Gathman

(10) Patent No.: US 10,079,582 B2
(45) Date of Patent: Sep. 18, 2018

(54) WIDEBAND AMPLIFIER CIRCUITS AND METHODS

(71) Applicant: QUALCOMM Incorporated, San Diego, CA (US)

(72) Inventor: Timothy Gathman, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/242,404

(22) Filed: Aug. 19, 2016

(65) Prior Publication Data
US 2017/0179910 A1 Jun. 22, 2017

Related U.S. Application Data

(60) Provisional application No. 62/269,829, filed on Dec. 18, 2015, provisional application No. 62/370,217, filed on Aug. 2, 2016.

(51) Int. Cl.
*H03G 3/30* (2006.01)
*H03F 1/26* (2006.01)
(Continued)

(52) U.S. Cl.
CPC ........... *H03G 3/3042* (2013.01); *H03F 1/086* (2013.01); *H03F 1/26* (2013.01); *H03F 1/42* (2013.01);
(Continued)

(58) Field of Classification Search
USPC ................................. 330/252–261
See application file for complete search history.

(56) References Cited

U.S. PATENT DOCUMENTS 7,760,029 B2 7/2010 Sutardja
9,160,388 B2 10/2015 Mikhemar et al.
(Continued)

FOREIGN PATENT DOCUMENTS

CN 102820857 A 12/2012

OTHER PUBLICATIONS

Abu-Taha J., et al., "Broadband Transimpedance Amplifier TIA in CMOS 0.18μm Technology Using Matching Technique," 2015, 4 pages.
(Continued)

*Primary Examiner* — Hieu Nguyen
(74) *Attorney, Agent, or Firm* — Qualcomm Incorporated/Seyfarth Shaw LLP; Alan M. Lenkin

(57) ABSTRACT

An wideband amplifier circuit such as a transimpedance amplifier achieves improved amplifier and/or system performance, such as a reduced input impedance. The transimpedance amplifier may use a complementary common gate stage that receives an input signal and generates current to a current summing stage. In one instance, an input current is received by a complimentary common gate stage that includes a first common gate transistor and a second common gate transistor, each having different polarities, in which the first terminals of each of the transistors are configured to receive the input current. Each of the transistors generates an output current to a current summing stage that generates an output voltage at an output terminal. The output voltage may be based on the combined currents from the first common gate transistor and second common gate transistor.

24 Claims, 11 Drawing Sheets

(51) Int. Cl.

| | |
|---|---|
| *H03F 3/195* | (2006.01) |
| *H03F 3/24* | (2006.01) |
| *H03F 3/45* | (2006.01) |
| *H03F 1/08* | (2006.01) |
| *H03F 1/42* | (2006.01) |
| *H03F 3/19* | (2006.01) |
| *H03F 3/72* | (2006.01) |

(52) U.S. Cl.
CPC .............. *H03F 3/19* (2013.01); *H03F 3/195* (2013.01); *H03F 3/245* (2013.01); *H03F 3/45179* (2013.01); *H03F 3/45188* (2013.01); *H03F 3/45475* (2013.01); *H03F 3/72* (2013.01); *H03F 2200/294* (2013.01); *H03F 2200/336* (2013.01); *H03F 2200/451* (2013.01); *H03F 2200/72* (2013.01); *H03F 2200/91* (2013.01); *H03F 2203/45091* (2013.01); *H03F 2203/45288* (2013.01); *H03F 2203/45306* (2013.01); *H03F 2203/45526* (2013.01)

(56) References Cited

U.S. PATENT DOCUMENTS

| | | | |
|---|---|---|---|
| 9,236,841 B2* | 1/2016 | Ciubotaru | H03F 3/45179 |
| 9,413,300 B2* | 8/2016 | Uppathil | H03F 1/223 |
| 2012/0064852 A1 | 3/2012 | Lee et al. | |

OTHER PUBLICATIONS

Groeneveld D.J.A., "Bandwidth Extension and Noise Cancelling for TIAs: Two New Common Source TIA Implementations," University of Twente, Sep. 2010, 53 pages.

Barend V-L., et al., "A 0.7-1.15GHz Complementary Common-Gate LNA in 0.18 [mu] m SOI CMOS with +15dBm IIP3 and 1kV HBM ESD Protection", 2013 Proceedings of the ESSCIRC (ESSCIRC), IEEE, Sep. 14, 2015 (Sep. 14, 2015), XP032803361, pp. 164-167.

International Search Report and Written Opinion—PCT/US2016/062588—ISA/EPO—dated Mar. 1, 2017.

Jun C., et al., "A 0.06 mm2 6 dBm IB1db Wideband CMOS Class-AB LNTA for SAW-Less Applications", 2015 IEEE 11th International Conference on ASIC (ASICON), IEEE, Nov. 3, 2015 (Nov. 3, 2015), XP032925975, pp. 1-4.

Pavan S., et al., "Power Reduction in Continuous-Time Delta-Sigma Modulators Using the Assisted Opamp Technique", IEEE Journal of Solid-State Circuits, IEEE Service Center, Piscataway, NJ, USA, vol. 45, No. 7, Jun. 25, 2010 (Jun. 25, 2010), XP011312127, pp. 1365-1379.

Sheng C., et al., "A 2.5 GHz 90nm CMOS Triple Gain Mode LNA for WiMAX Applications", Signals, Systems and Electronics, 2007, ISSSE 07, International Symposium on, IEEE, PI, Jul. 1, 2007 (Jul. 1, 2007), XP031129290, pp. 367-369.

Blaakmeer S.C., et al., "Wideband Balun-LNA with Simultaneous Output Balancing, Noise-Canceling and Distortion-Canceling", IEEE Journal of Solid-State Circuits, IEEE Service Center, Piscataway, NJ, US, vol. 43, No. 6, Jun. 1, 2008 (Jun. 1, 2008), pp. 1341-1350, XP011215762 ISSN: 0018-9200.

\* cited by examiner

WIDEBAND AMPLIFIER CIRCUITS AND METHODS

CROSS-REFERENCE TO RELATED APPLICATION

The present application claims the benefit of U.S. Provisional Patent Application No. 62/370,217, filed on Aug. 2, 2016, and titled "WIDEBAND AMPLIFIER CIRCUITS AND METHODS," and U.S. Provisional Patent Application No. 62/269,829, filed on Dec. 18, 2015, and titled "WIDEBAND TRANSIMPEDANCE AMPLIFIER (TIA) CIRCUITS AND METHODS," the disclosures of which are expressly incorporated by reference herein in their entireties.

TECHNICAL FIELD

The present disclosure generally relates to amplifier circuits. More specifically, aspects of the present disclosure relate to wideband amplifier circuits and methods.

BACKGROUND

Data communications and a number of other electronic circuit signal processing applications require ever increasing bandwidths. One common circuit in such systems is an amplifier, and more particularly, a trans-impedance amplifier (TIA). TIAs typically receive an input current and generate an amplified output voltage. Amplification is often performed in multiple stages, where an input stage that receives an input current signal may require very low input impedance. The input stage may translate the input current signal into a voltage signal, and the voltage signal is amplified in an output stage.

As the bandwidth of TIAs increases, it becomes increasingly difficult to maintain low input impedance while also achieving low noise and low power targets.

SUMMARY

In an aspect of the present disclosure, a circuit is presented. The circuit may be an amplifier circuit (e.g., a wideband amplifier circuit) that may be used in a user equipment or mobile device. The circuit includes a first common gate transistor having a first terminal, a second terminal, and a first control terminal. The first terminal is configured to receive an input signal. The first common gate transistor includes a first polarity. The circuit also includes a second common gate transistor having a first terminal, a second terminal, and a second control terminal. The first terminal of the second common gate transistor is coupled to the first terminal of the first common gate transistor. The first terminal is configured to receive the input signal. The second common gate transistor includes a second polarity. The circuit further includes a current summing stage having a first terminal coupled to the second terminal of the first common gate transistor, a second terminal coupled to the second terminal of the second common gate transistor, and an output terminal. The first output terminal is configured to generate a first output voltage based on combined currents from the first and second common gate transistors (e.g., a differential output signal). The circuit may be configured in a wireless transmitter channel.

In another aspect of the present disclosure, a circuit is presented. The circuit may be an amplifier circuit (e.g., a wideband amplifier circuit) that may be used in a user equipment or mobile device. The circuit includes a common gate transistor having a first terminal, a second terminal, and a first control terminal. The first terminal of the common gate transistor is configured to receive an input signal. The circuit also includes a common source transistor (e.g., a first common source transistor) having a first terminal, a second terminal, and a second control terminal. The second control terminal of the common source transistor is configured to receive an inverse of the input signal and the first terminal is configured to receive a bias current. The circuit further includes a cascode transistor (e.g., a first cascode transistor) having a first terminal, a second terminal, and a third control terminal. The first terminal of the cascode transistor is coupled to a node. The node is coupled to the second terminal of the common source transistor and the second terminal of the common gate transistor. The third control terminal of the cascode transistor is configured to receive a bias voltage. The second terminal of the common gate transistor receives a first portion of the bias current from the second terminal of the common source transistor. The first terminal of the cascode transistor receives a second portion of the bias current from the second terminal of the common source transistor. The first portion of the bias current is greater than the second portion of the bias current.

In yet another aspect of the present disclosure, a circuit is presented. The circuit may be an amplifier circuit (e.g., a wideband amplifier circuit) that may be used in a user equipment or mobile device. The circuit includes a first transistor of a first transistor polarity having a gate, a source, and a drain. The source may be configured to receive a first component of a differential input signal. The circuit also includes a second transistor of a second transistor polarity and having a gate, a source, and a drain. The source of the second transistor may be coupled to the source of the first transistor to receive the first component of the differential input signal. The circuit further includes a third transistor of the first transistor polarity and having a gate, a source, and a drain. The source may be configured to receive a second component of the differential input signal. The circuit also includes a fourth transistor of the second transistor polarity and having a gate, a source, and a drain. The source of the fourth transistor may be coupled to the source of the third transistor to receive the second component of the differential input signal. The circuit further includes a fifth transistor of the second transistor polarity and having a gate, a source, and a drain. The drain of the fifth transistor may be coupled to the drain of the first transistor, and the gate of the fifth transistor may be configured to receive the second component of the differential input signal. The circuit also includes a sixth transistor of the second transistor polarity and having a gate, a source, and a drain. The drain of the sixth transistor may be coupled to the drain of the third transistor, and the gate of the sixth transistor may be configured to receive the first component of the differential input signal. The circuit further includes a current summing stage arranged between the drains of the first transistor and the third transistor and the drains of the second transistor and the fourth transistor.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
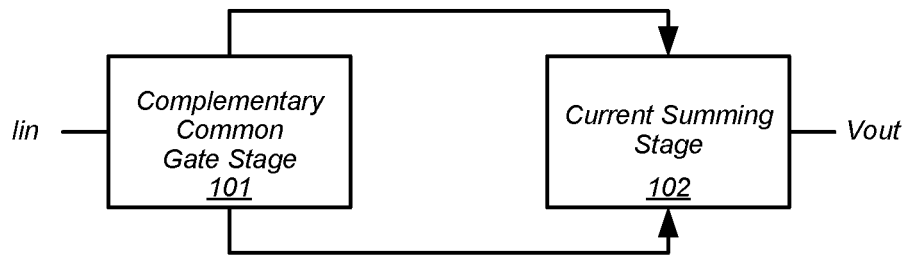
FIG. 1 illustrates an amplifier circuit architecture according to an aspect of the present disclosure.

FIG. 1 illustrates an amplifier circuit architecture according to an aspect of the present disclosure. Features and advantages of the present disclosure include a complementary common gate stage that receives an input signal and generates currents to a current summing stage. Some amplifier applications may be configured to receive currents, and it may be desirable to translate the received current into amplified voltages. Such circuits are sometimes referred to as transimpedance amplifiers (TIAs). For some applications, it may be beneficial to have a low input impedance, for example. Aspects of the present disclosure may use a complementary common gate stage 101 to achieve low input impedance and thereby improve overall amplifier or system performance. In this example, an input current, Iin, is received by complementary common gate stage 101. As illustrated in example circuit below, complementary common gate stage 101 may include first and second common gate transistors having different polarities (e.g., PMOS or NMOS) where first terminals (e.g., sources) of each transistor are configured to receive an input signal (here, current, Iin). The transistors are configured in a common gate configuration such that control terminals (e.g., gates) are coupled to bias voltages, for example, and each transistor generates an output current to a current summing stage 102. Current summing stage 102 may include a first terminal coupled to an output terminal (e.g., a drain) of the first common gate transistor, a second terminal coupled to an output terminal (e.g., a drain) of the second common gate transistor, and an output terminal configured to generate an output voltage based on combined currents from each common gate transistor. In some aspects described below, the complementary common gate stage 101 may be a differential complementary common gate stage including third and fourth transistors configured differentially with the first and second transistors, respectively, to receive a differential input signal and produce differential currents. As described in more detail below, complementary common gate stages may result in reduced input impedance across a wide range of frequencies. Furthermore, complementary common gate stages may allow for noise cancellation circuits or current reuse, or both, for example, as illustrated in examples below.

Figure 2:
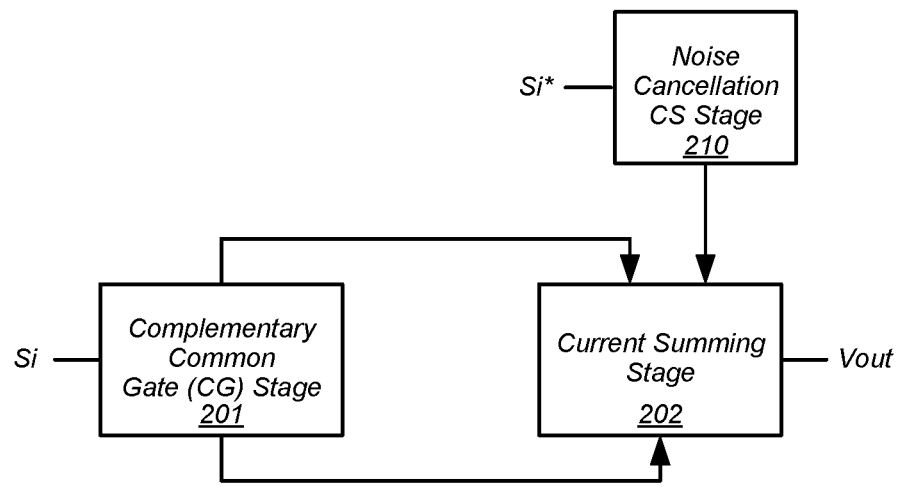
FIG. 2 illustrates an amplifier circuit architecture with noise cancellation according to an aspect of the present disclosure.

FIG. 2 illustrates an amplifier circuit architecture with noise cancellation according to an aspect of the present disclosure. Further advantages of certain aspects may include noise cancellation that may be advantageous in some applications. In this illustrative example, an input signal, Si, is received by complementary common gate (CG) stage 201 and currents from the CG stage are coupled to current summing circuit 202. Additionally, in this aspect of the present disclosure, a noise cancellation common source (CS) stage 210 receives an inverse of the input signal, Si* and generates a current to the current summing stage 202. In some aspects, noise generated in the CG stage 201 may be canceled by combining current from the CG stage 201 with a current generated in the CS stage 210 to cancel the noise. Amplifiers employing such techniques may achieve very low input impedance, low noise, and wide bandwidth, for example, as illustrated in some of the examples below.

Figure 3:
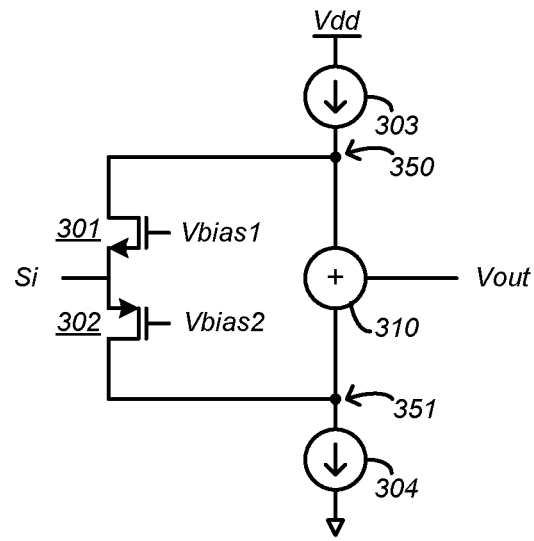
FIG. 3 illustrates a complementary common gate stage and summing circuit according to an aspect of the present disclosure.

FIG. 3 illustrates a complementary common gate stage and summing circuit according to an aspect of the present disclosure. In this example circuit, a complementary CG stage includes a first common gate transistor 301 having a first terminal (e.g., a source), a second terminal (e.g., a drain), and a control terminal (e.g., a gate). The first terminal may be configured to receive an input signal, Si, which may be a current for example. The first common gate transistor 301 may have a first polarity, such as P-type (e.g., PMOS). The complementary CG stage may further include a second common gate transistor 302 having a first terminal (e.g., a source), a second terminal (e.g., a drain), and a control terminal (e.g., a gate). In this example, the source of transistor 302 may be coupled to the source of the transistor 301 such that transistor 302 is also configured to receive the input signal, Si. Here, the second common gate transistor 302 has a second polarity, such as N-type (e.g., NMOS). In this example, transistor 301 has a gate coupled to a first bias voltage, Vbias1, and transistor 302 has a gate coupled to a second bias voltage, Vbias2. The circuit is complementary, for example, in the sense that two common gate configured transistors have sources coupled to the input signal and are of opposite polarity (e.g., one N-type and the other P-type).

In some applications, it may be desirable to have a low input impedance, Zin. A typical common gate configured transistor may have a Zin related to 1/gm, where "gm" is the transconductance of the transistor, for example. Features and advantages of the complementary common gate (CG) stage include a lower input impedance Zin. For instance, the input impedance of the complementary CG stage may be as follows: Zin,CG=1/(gm,p+gm,n), which is approximately equal to 1/(2 gm) if the transconductance is balanced between the NMOS and PMOS devices, for example. Thus, a complementary CG stage may have half the input impedance of a single transistor CG stage, for example.

Currents from the complementary CG stages are coupled to nodes 350 and 351 and are combined with currents from bias current sources 303 and 304, respectively. These currents are combined to produce an output voltage Vout in summing circuit 310, for example. In some aspects disclosed below, a summing circuit may comprise cascode transistors (e.g., a first cascade transistor), for example. Current from bias current source 303 may be split between the summing circuit 310 and the CG transistors 301 and 302. In some aspects, the CG transistors 301 and 302 receive a first portion of the bias current and transistors in the summing circuit, for example, receive a second portion of the bias current. Input impedance of the CG transistors may be further reduced with increased bias current, for example. Thus, in some applications the first portion of the bias current in the CG transistors is greater than the second portion of the bias current in the summing circuit to further reduce the input impedance of the amplifier, for example.

Figure 4:
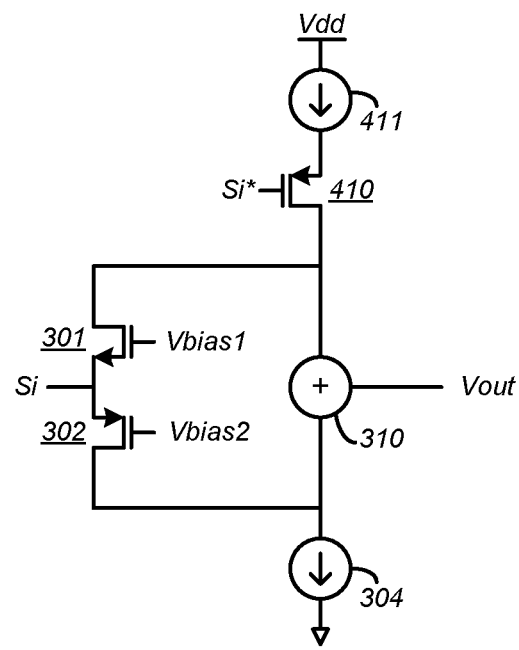
FIG. 4 illustrates a complementary common gate stage with noise cancellation according to an aspect of the present disclosure.

FIG. 4 illustrates a complementary common gate stage with noise cancellation according to an aspect of the present disclosure. In some aspects, a common source (CS) stage may be included for noise cancellation. This is illustrated in FIG. 4, which includes CS transistor 410 (here, a PMOS device) having a source coupled to receive a bias current 411, a drain coupled to a drain of CG transistor 301 and summing circuit 310. A gate of CS transistor 410 is configured to receive an inverse of the input signal, Si*. In some aspects described below, Si* may be one component of a differential signal, where Si is the other component of the differential signal, for example. Accordingly, as Si changes in one direction, Si* typically changes in the opposite direction. Thus, noise injected into the circuit by the CG transistors may be canceled out by an opposite component injected into the CS transistor 410, for example. Another aspect may be current reuse. For example, increasing the bias current in the CS transistor 410 may reduce input referred noise of the CS transistor 410. Increasing current in the CG transistors 301 and 302 reduces input impedance. Accordingly, some aspects may increase the bias current in CS transistor 410 and direct a larger portion of the bias current to CG transistors 301 and 302 to reuse the current to reduce the input impedance of the CG stage, for example. For example, in some aspects a common gate transistor may be at least two times (2×) greater in size than a transistor in the current summing stage 310. Noise in the CG stage may, in turn, be canceled by the CS stage. Complete cancellation of the noise from the CG stage occurs when the transconductance gm of the CS noise-cancelling stage 410 is equal to 1/Rs, where Rs is the source impedance supplying the signal Si to 301 and 302.

Figure 5:
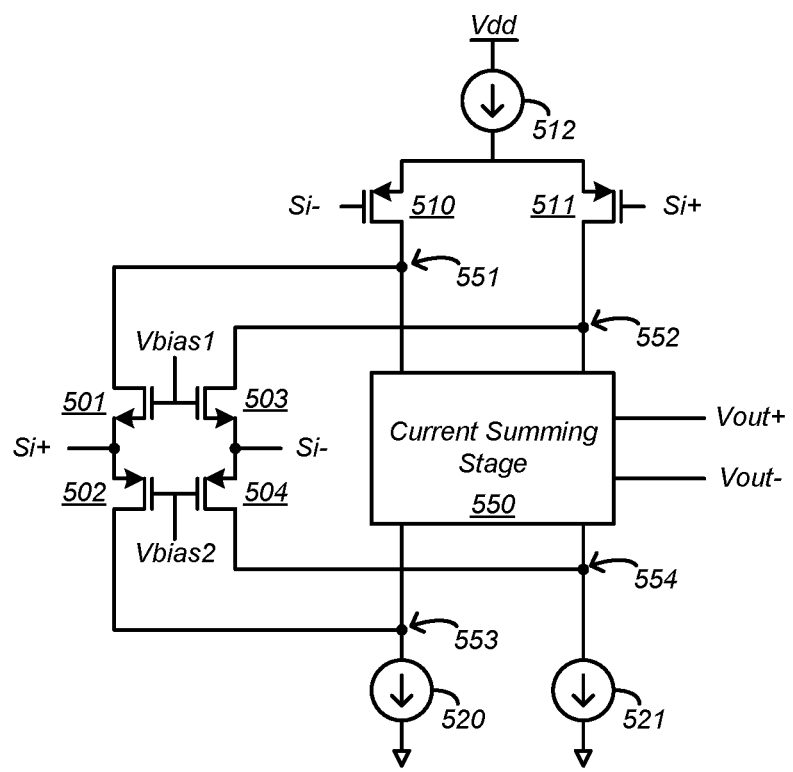
FIG. 5 illustrates a differential complementary common gate stage with noise cancellation according to an aspect of the present disclosure.

FIG. 5 illustrates a differential complementary common gate stage with noise cancellation according to an aspect of the present disclosure. In this example, a differential complementary common gate stage comprises common gate transistors 501-504. A first half of the differential circuit includes common gate NMOS transistor 501 and common gate PMOS transistor 502 configured with sources coupled together to receive a first (here, positive) differential component of an input signal, Si+. Similarly, a second half of the differential circuit includes common gate NMOS transistor 503 and common gate PMOS transistor 504 configured with sources coupled together to receive a second (here, negative) differential component of an input signal, Si−. NMOS transistors 501 and 503 have gates coupled to bias voltage, Vbias1, and PMOS transistors 502 and 504 have gates coupled to bias voltage, Vbias2.

Current generated in common gate transistors 501-504 is coupled to nodes 551-554 at inputs of a current summing stage 550. In this example, differential common source PMOS transistors 510-511 have source terminals coupled to a bias current source 512 and drain terminals coupled to nodes 551 and 552, respectively. The gate terminal of CS transistor 510 is configured to receive the negative differential component of the input signal, Si−, and the gate terminal of CS transistor 511 is configured to receive the positive differential component of the input signal, Si+. Accordingly, in this example, the CG stage (e.g., transistor 501) receiving one component of the differential input signal is coupled to the same node (e.g., node 551) as the CS stage (e.g., transistor 510) receiving the other component of the differential input signal.

Advantages of the example circuit in FIG. 5 may include reduced input impedance without sacrificing noise performance, bandwidth, or transistor area. For instance, some applications may benefit from improved noise performance, such as reduced thermal or flicker noise. Large transistor devices may be used to improve flicker noise because device area is inversely proportional to flicker noise; however, large devices may result in higher bias currents, parasitic capacitance, reduced bandwidth, and increased die area and cost. Some aspects may couple a larger portion of the bias current from CS transistors 510 and 511 to CG transistors 501-504, with a smaller portion of the bias current flowing into the summing stage 550 (e.g., from two times (2×) as much current to ten times (10×) as much current into the CG stages). For example, the common gate transistors may be at least two times greater in size than cascode transistors in the current summing stage. Higher bias currents reduce Zin of the CG stage. Additionally, a complementary common gate stage input impedance Zin may be one-half (½) the input impedance of a single common gate stage as mentioned above. Thus, very low input impedances may be achieved using a complementary CG stage with high bias currents reused from a CS stage as illustrated in FIG. 5, for example.

However, higher bias currents may also increase noise in the CG stage. For example, noise current in CG transistors can result in a noise voltage at the source of the CG transistors 501-504. Features and advantages of the present disclosure include coupling inverted input signals to the CG and CS devices to cancel noise. For instance, in this example, noise generated in transistors 501 and 502 may appear as a voltage at Si+ and noise generated in transistors 503 and 504 may appear as a voltage at Si−. In this example, the CG stage inputs are cross coupled to the CS stage inputs so that inverted versions of the CG signals are presented at the CS stage inputs. The inverted signals received by the CS stage produce inverse current signals into nodes 551 and 552, which are combined with currents from the CG stage at nodes 551 and 552 to cancel the noise in the CG stage (here, differentially). In some aspects, the transconductance, gm, of the CS stage may be set to establish a gate-to-drain CS transistor gain sufficient reduce or cancel the noise from the CG stage, for example. As mentioned previously, the gm of the CS stage can be chosen based of off the source impedance driving the signals Si+ and Si− such that complete cancellation of the CG stage noise occurs. In one example implementation, the noise from the common-source noise cancelling gm devices may dominates the overall noise, and an optimal noise implementation for some circuits may not correspond to exact cancellation of the noise in the CG devices. Instead, an advantageous example implementation may be when the CS stages have a slightly higher gm than the CG stages, thereby reducing the input-referred noise of the CS stages and the noise in the load and second stage, for example.

Figure 6:
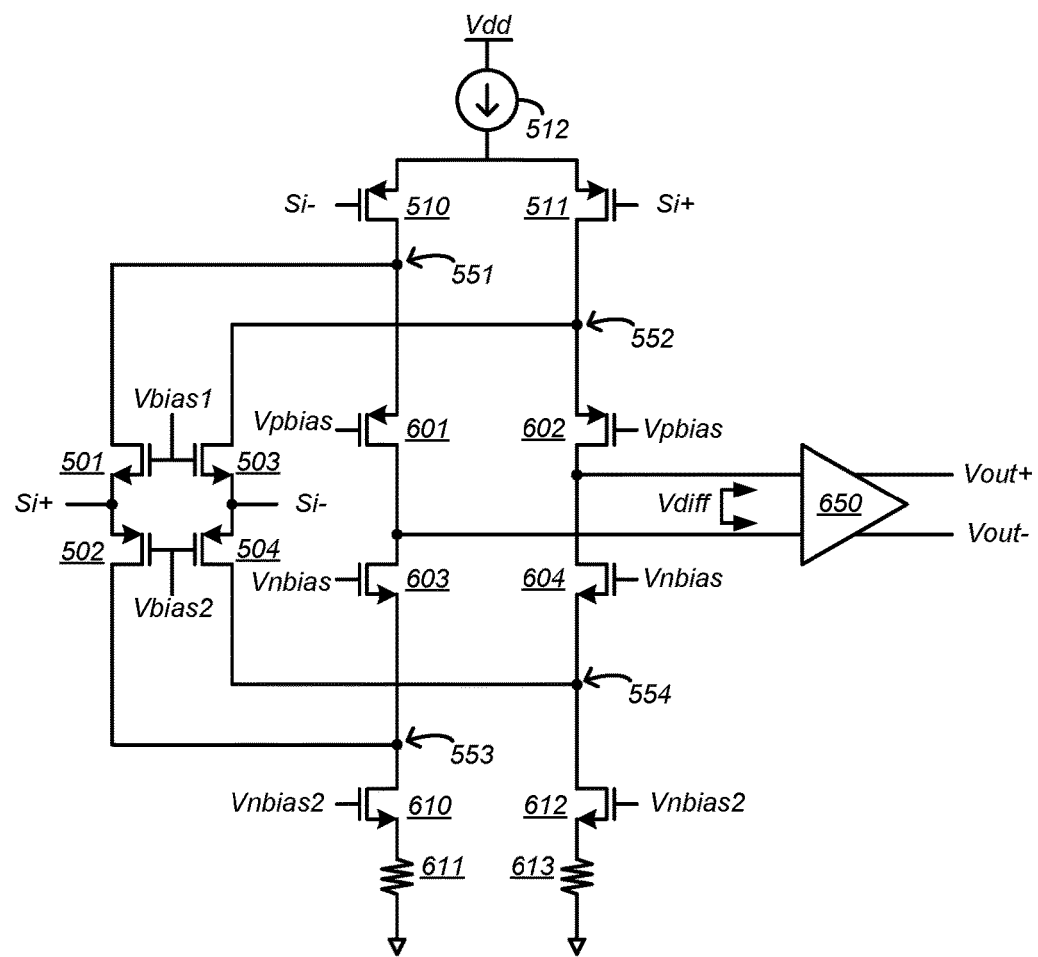
FIG. 6 illustrates an example implementation of a transimpedance amplifier according to an aspect of the present disclosure.

FIG. 6 illustrates an example implementation of a transimpedance amplifier according to an aspect of the present disclosure. In this example, differential input signal components are denoted Si+ and Si−. The differential input signal is received on source terminals of a differential complementary common gate stage including CG transistors 501-504 having drains coupled to nodes 551-554, respectively. A differential common source stage includes CS transistors 510 and 511, which receive cross coupled inputs Si− and Si+, respectively, to cancel noise in the CG stage as described above. In this example, a current summing circuit comprises cascode transistors 601-604. Transistors 601-602 are PMOS transistors having source terminals coupled to nodes 551-552, respectively, and transistors 603-604 are NMOS transistors having source terminals coupled to nodes 553-554, respectively. Low side current sources in this example are implemented using NMOS transistors 610-611 and resistors 611-612. Current from the drains of CG transistors 501-504 is combined in cascode transistors 601-604 to produce a differential voltage, Vdiff. Voltage Vdiff is coupled to an output stage 650 which may increase the swing of the voltage, for example, for subsequent processing.

Figure 7:
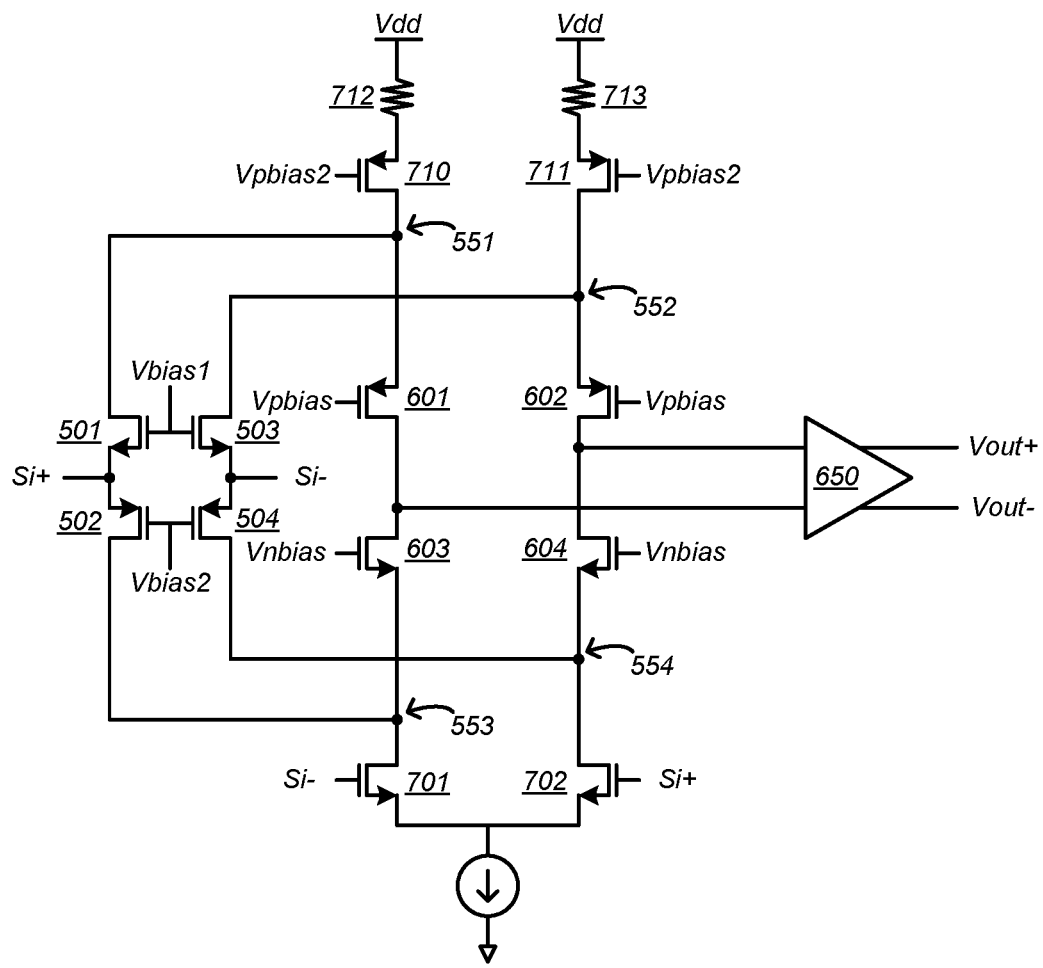
FIG. 7 illustrates an example implementation of a transimpedance amplifier according to an aspect of the present disclosure.

FIG. 7 illustrates an example implementation of a transimpedance amplifier according to an aspect of the present disclosure. In this example, a differential input signal, Si+/Si−, is cross coupled to an NMOS common source stage comprising NMOS transistor 701 and NMOS transistor 702. Accordingly, noise from complementary CG transistors 501-504 is coupled to gates of NMOS transistors 701 and 702 and canceled in whole in or part at nodes 553 and 554. In this example, bias current sources coupled to nodes 551 and 552 comprise PMOS transistors 710-711 and resistors 712-713, respectively.

Figure 8:
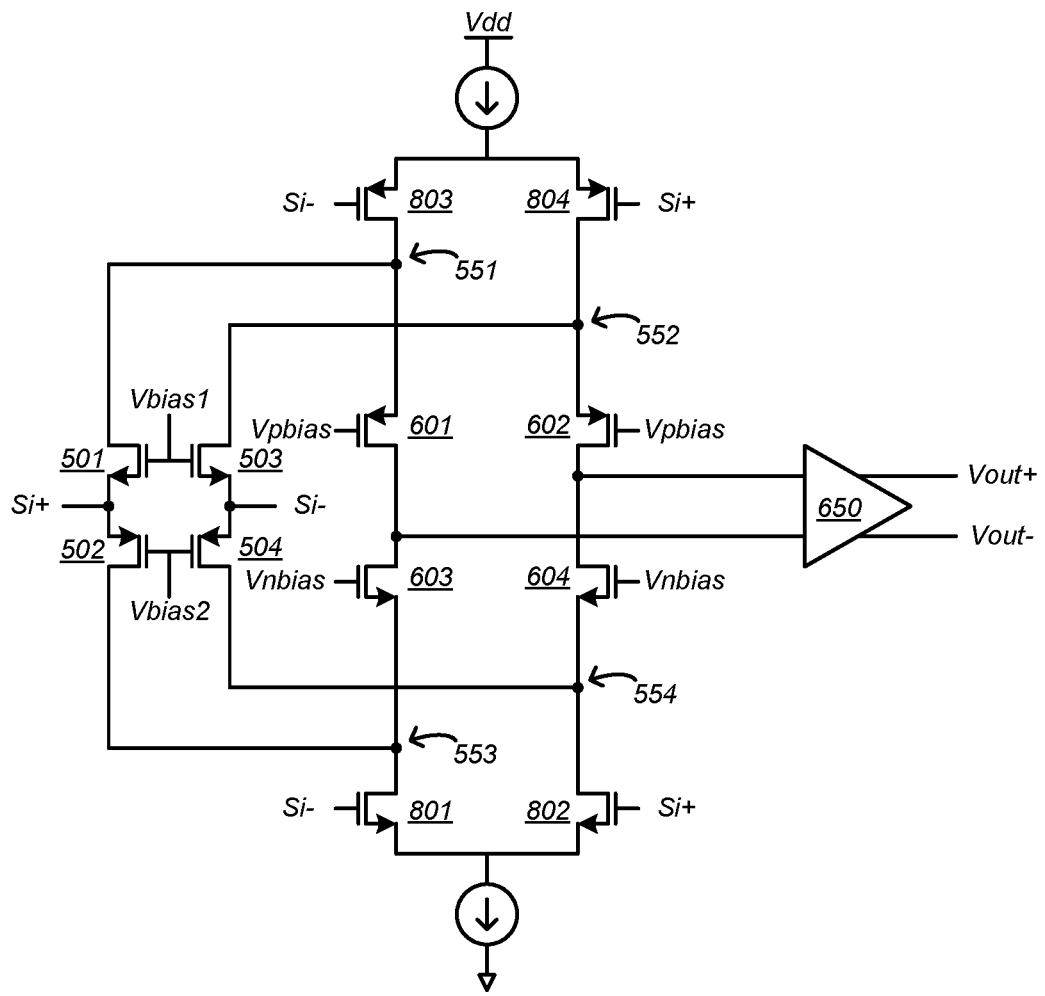
FIG. 8 illustrates an example implementation of a transimpedance amplifier according to an aspect of the present disclosure.

FIG. 8 illustrates an example implementation of a transimpedance amplifier according to an aspect of the present disclosure. In this example, a differential input signal, Si+/Si−, is cross coupled to an NMOS common source stage comprising NMOS transistor 801 and NMOS transistor 802 and a PMOS common source stage comprising PMOS transistor 803 and 804. Accordingly, noise from complementary CG transistors 501-504 is coupled to gates of NMOS transistors 801 and 802 and gates of PMOS transistors 803 and 804 and canceled in whole in or part at nodes 551-554.

Figure 9:
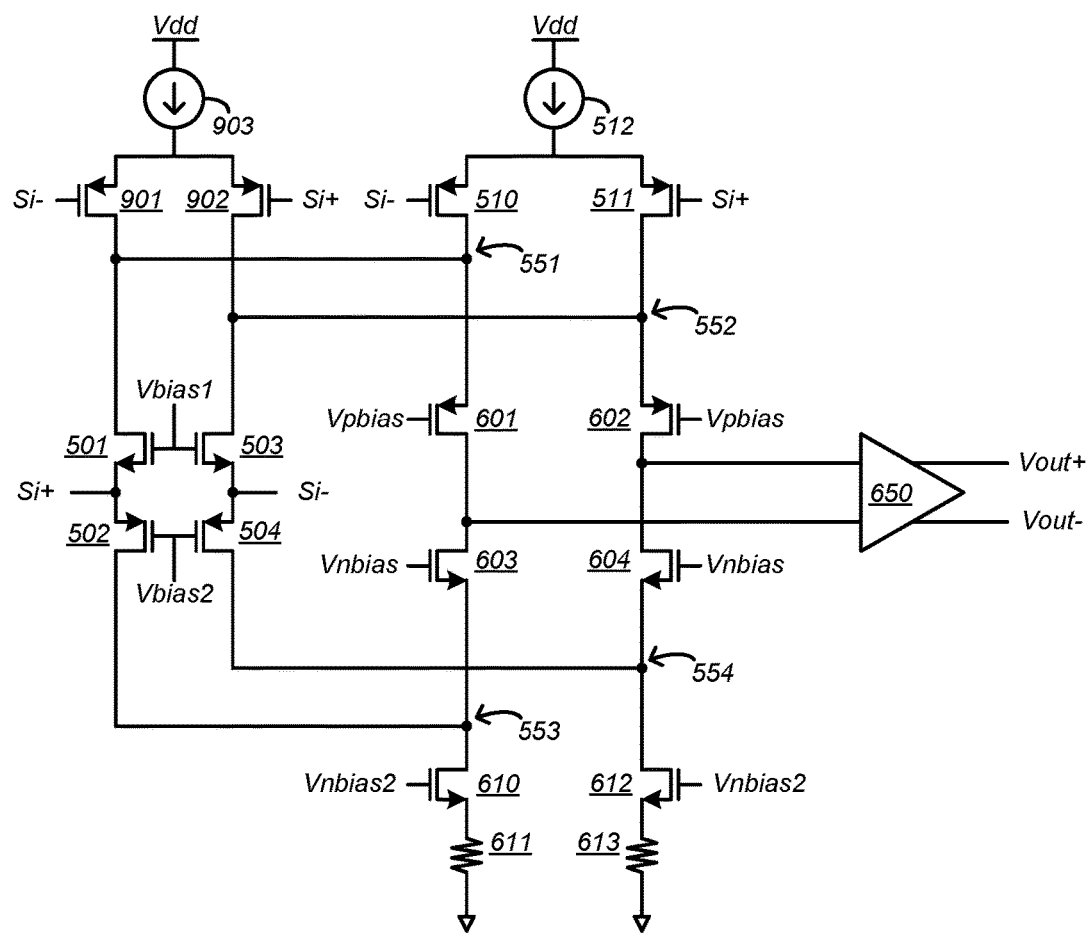
FIG. 9 illustrates a hybrid input stage according to another aspect of the present disclosure.

FIG. 9 illustrates a hybrid input stage according to another aspect. This example introduces an additional common source path which may be enabled for lower bandwidth modes of operation to achieve better noise performance, for example. For example, common source transistors 901 and 902 have drain terminals coupled to the drain terminals of CG transistors 501 and 503, respectively. Gate terminals of transistors 901 and 902 receive cross coupled input signals relative to the source input terminals of CG transistors 501-504. Source terminals of transistors 901 and 902 are coupled together and to bias current source 903 to form a differential amplifier pair. Thus, differential transistors 901 and 902 are configured in parallel with differential transistors 510 and 511 to drive the cascode transistor in the current summing circuit, for example. Current from the drains of transistor 901 and 902 is combined with current from the drains of transistors 510 and 511 at nodes 551 and 552, respectively. One of ordinary skill in the art will recognize that drains of NMOS transistors could be similarly coupled to drains of PMOS CG transistors 502 and 504 if the CS stage were coupled to nodes 553 and 554 as illustrated in FIG. 7, for example.

Feature and advantages of the example aspect in FIG. 9 may include reconfiguring the amplifier into different modes of operation. In a first mode of operation, the common gate transistors 501-504 may be disabled to mitigate the noise from those devices to achieve better noise performance and the common source transistors 901 and 902 are enabled. The first mode of operation may be used for lower bandwidths, for example. In a second mode of operation, common gate transistors 501-504 may be enabled and common source transistor disabled, for example, so the circuit operates as described above.

Figure 10:
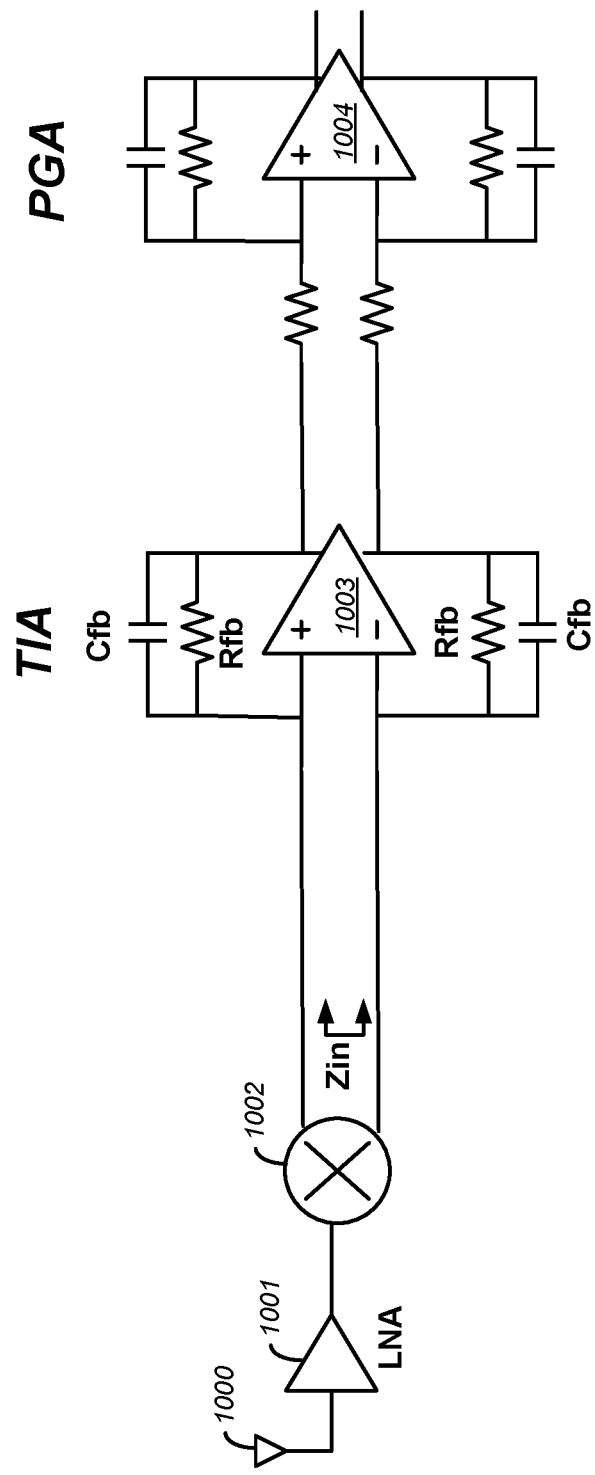
FIG. 10 illustrates an example of an amplifier in a wireless application according to an aspect of the present disclosure.

FIG. 10 illustrates an example of an amplifier in a wireless application according to an aspect of the present disclosure. One advantageous application of some aspects described above is in wireless communications. Aspect of the present disclosures of the present disclosure may be applicable to analog filters, such as receiver baseband filters (RxBBF), transmitter baseband filters (TxBBF), global positioning system baseband filters (GPS BBF), and feedback receiver baseband filters (FBRx BBF), for example. Some applications of the above described techniques relates to improved transimpedance amplifiers (TIAs) operational transconductance amplifier (OTA) performance in a receiver. A wide bandwidth TIA is desirable for low Zin across frequency, high linearity (IIP3, IIP2), high-bandwidth operation for ever-increasing data rates, and minimal degradation in frequency-dependent residual side bands (RSB). Example aspect of the present disclosures of the disclosure may include WAN/WLAN convergence which may support VHT160, for example. Accordingly, in some aspect of the present disclosures, TIA pole bandwidths of 80 MHz, for example, and beyond may be supported, which may be achieved with a TIA with a unity-gain bandwidth (UGF) significantly higher than 80 MHz (at least 2×, 10× is desirable for pole accuracy). At the same time, low 1/f noise performance may also be important for low frequency noise performance, demanding very large input devices which severely limit the available TIA BW. Traditional TIA designs often either sacrifice noise (1/fn esp.), current, or linearity to achieve high BW. The techniques described herein may include a TIA OTA topology which achieves high linearity, high BW, and good 1/fn noise performance via noise cancelling, for example.

FIG. 10 illustrates an example wireless receiver channel including an amplifier according to the present disclosure. A low noise amplifier (LNA) 1001 has an input coupled to an antenna to receive a modulated RF signal, and an output of amplifier 1001 is coupled to a mixer 1002 (aka downconverter), which may be a passive mixer, for example. LNA 1001 may provide some noise suppression and filtering. A passive mixer may have no DC power dissipation of bias current, for example, and may comprise transistors configured in series between an output of the LNA and a subsequent stage. Noise in wireless receivers is typically more sensitive for circuitry closer to the antenna. Accordingly, noise performance of such circuits may be an important factor in the design. In this example, an RF signal may be directly converted from a modulation (or carrier) frequency to baseband, which is referred to as direct conversion. Direct conversion systems can suffer if there is too much low frequency noise such as flicker noise or 1/f noise. In some applications, amplifier 1003 according to aspect of the present disclosures described above may be used to amplify and/or filter signals from mixer 1002 as shown, for example. In this example, amplifier 1003 performs current to voltage conversion (or transimpedance) amplification. As mentioned above, certain aspect of the present disclosures may have low input impedance, Zin, which is typically required to be low and relatively flat over frequency in the case of a current-driven passive mixer, for example. Amplifiers with higher input impedance may produce impedance mismatch, for example, which can cause errors in in-phase (I) and quadrature (Q) components of the signal, for example. If the amplifier input impedance is too large, impedance mismatches can grow and cause channel errors between the I and Q signals, for example. FIG. 10 shows one channel, but in other aspect of the present disclosures two channels for I and Q could be used. These errors can negatively impact the frequency dependent residual side bands (FD-RSB), which is a measure of the image rejection ratio and may get worse with frequency. These issues may negatively impact wideband performance. The low noise and/or low input impedance of some aspect of the present disclosures described herein may improve wireless receiver system performance and overcome some or all of these challenges in particular designs, for example. In this example, amplifier 1003 is configured with input resistors, feedback resistors, and feedback capacitors to implement gain and filtering, for example. The differential outputs of amplifier 1003 are coupled to a programmable gain amplifier (PGA) 1004 to control the gain of the signals before conversion from analog to digital, for example.

A current-driven mixer may have the good Tx IIP2 when there is a zero-ohm input impedance looking into the TIA, which requires an infinite-bandwidth TIA OTA to maintain low Zin over all frequencies. Likewise, the TIA OTA linearity may be improved by the loop gain which degrades to a magnitude of 1 at the unity gain frequency (UGF). Ideally, the UGF frequency would be higher than all Tx-Rx frequency offsets; due to power constraints this is sometimes very difficult and may require additional filtering before the TIA to limit distortion. Maintaining good RSB may require that Zin looking into the TIA remain constant over all frequencies inside the signal bandwidth (high Zin enhances effects of Zin mismatch, and LO I/Q duty-cycle mismatch may degrade frequency-dependent RSB). Low Zin may require high UGF, for example. In previous designs, lowering 1/f noise has required large device area sacrificing the UGF (and high-frequency linearity). In some applications, the devices may be smaller than prior common source devices due to noise canceling, for example. In some aspect of the present disclosures, only a single common mode feedback amplifier may be included in the circuit.

Figure 11:
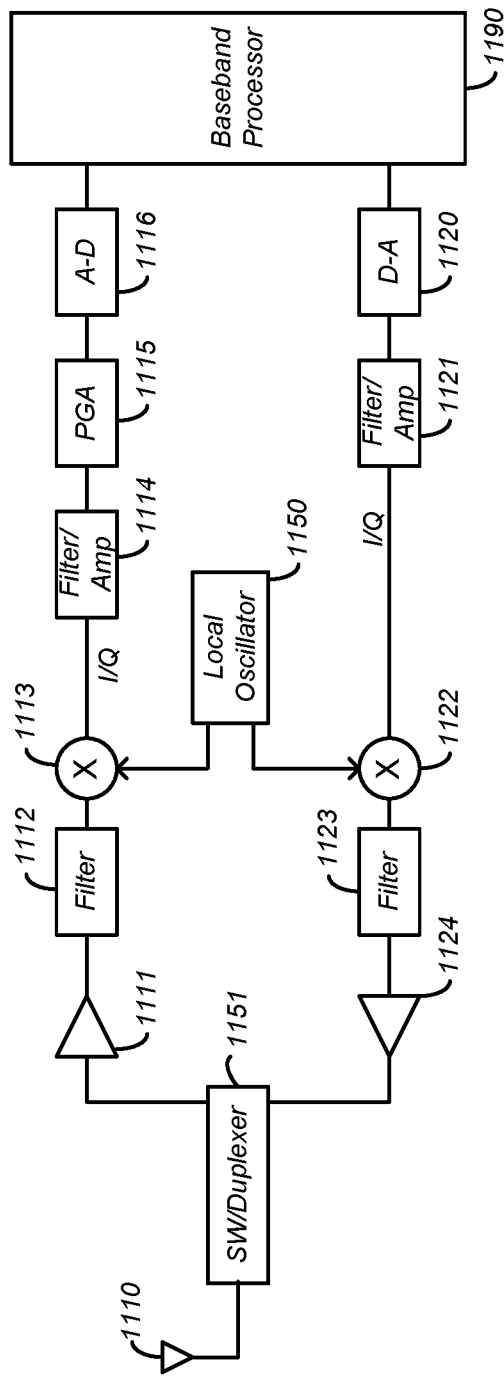
FIG. 11 illustrates another example of an amplifier in a wireless application according to an aspect of the present disclosure.

FIG. 11 illustrates another example of an amplifier in a wireless application according to an aspect of the present disclosure. In this example, a wireless communication channel may include an amplifier as described above in either the receive path, the transmit path, or both, for example. A receive path may include an antenna 1110 coupled to an input of a low noise amplifier (LNA) 1111, which may amplify a received RF signal. An output of LNA 1111 is coupled through a filter 1112 to a demodulator 1113 (e.g., a mixer) that also receives a local oscillator (LO) signal from a local oscillator 1150. The LO signal may down convert a received modulated RF signal down to a baseband frequency (e.g., direct conversion). Mixer 1113 may produce both I and Q outputs that are processed by separate circuit channels. One channel is shown here for illustrative purposes. The baseband signal (e.g., I and Q in separate circuit channels) may be received and filtered by filter/amplifier 1114 having a low input impedance and low noise using the techniques described herein, for example. The baseband signal may be amplified by programmable gain amplifier (PGA) 1115, and converted to digital signals by an analog-to-digital converter (A-D) 1116. The digital signals may then be processed by baseband processor 1190.

A transmit path may include receiving digital data to be transmitted in baseband processor 1190, where the data may be coded for transmission according to a RF transmission protocol, for example. The coded digital data signals may be converted to an analog baseband signal by digital to analog converter 1120, and filtered by filter/amplifier 1121, which may use an amplifier incorporating the techniques described herein. Again, digital to analog conversion may include both I and Q circuit channels, but only one is shown here for illustrative purposes. The filtered/amplified analog baseband signals may be upconverted by modulator (mixer) 1122, which also receives an LO signal from local oscillator 1150. The baseband signal is upconverted to RF, filtered at 1123, and driven onto the antenna using a power amplifier 1124. A switch or duplexer 1151 may, in some applications, direct input signals from the antenna to the LNA and output signals from the power amplifier to the antenna, for example.

Figure 12:
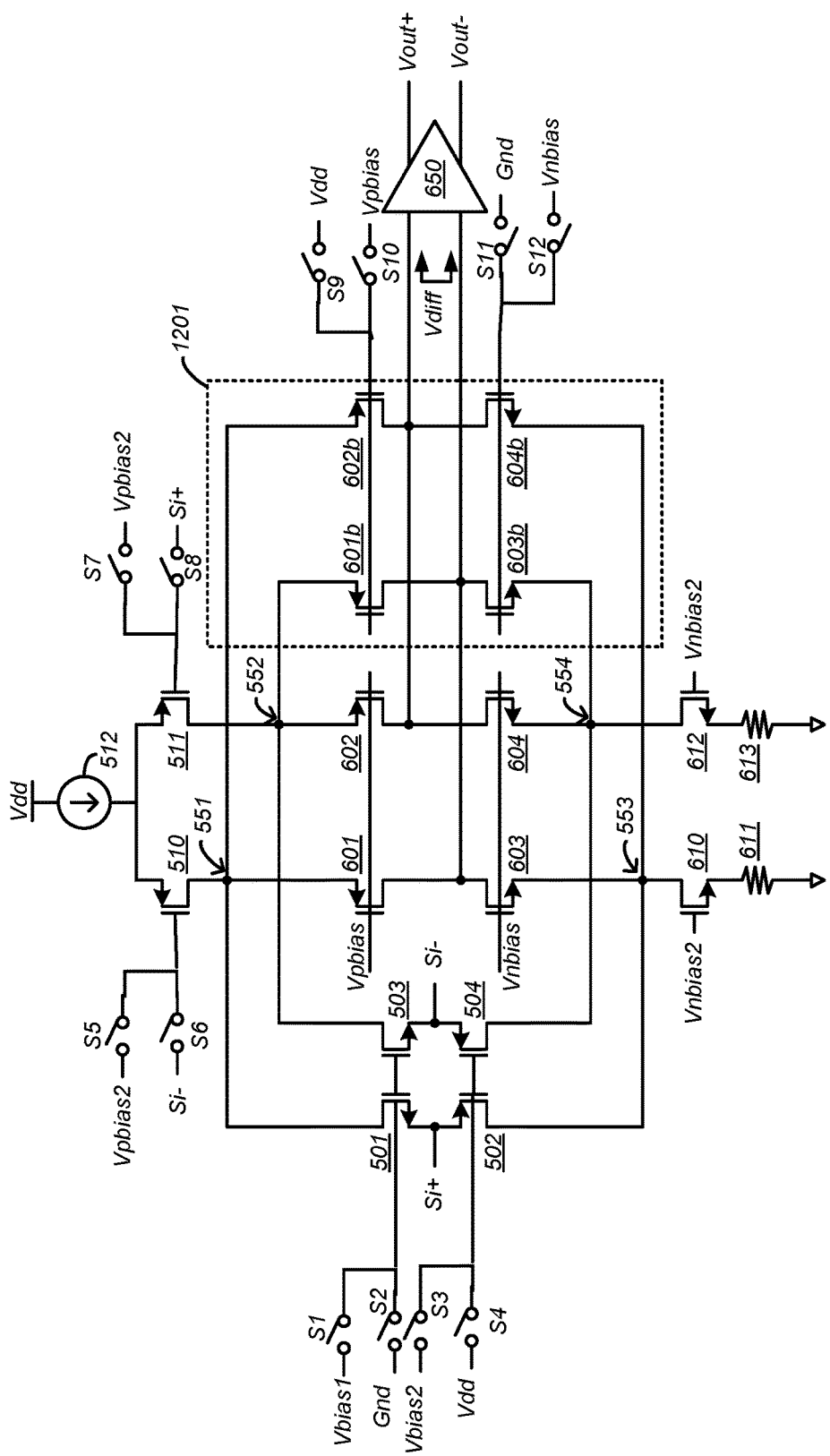
FIG. 12 illustrates a reconfigurable amplifier according to another example aspect of the present disclosure.

FIG. 12 illustrates a reconfigurable amplifier according to another example aspect of the present disclosure. In this example, a transimpedance amplifier may be configured in a common source configuration, a common gate configuration, or a common gate with noise cancelling configuration using switches to advantageously obtain different amplifier bandwidths to optimize the processing of different signals, for example. The switches may couple different bias voltages to transistors in the amplifier, for example, or couple different input voltages to the input transistors, for example. In this example, switches S1 and S2 are coupled to the gates of NMOS common gate transistors 501 and 503, switches S3 and S4 are coupled to the gates of PMOS common gate transistors 502 and 504, switches S5 and S6 are coupled to the gate of PMOS common source transistor 510, switches S7 and S8 are coupled to the gate of PMOS common source transistor 511.

Switches S1 and S2 couple different bias voltages to NMOS transistor 501 and 503. In this example, bias voltage Vbias1 turns transistors 501 and 502 on and bias voltage Gnd turns these transistors off. Similarly, switches S3 and S4 couple different bias voltages to PMOS transistors 502 and 504. In this example, bias voltage Vbias2 turns transistors 502 and 504 on and bias voltage Vdd turns these transistors off. Switches S5/S6 and S7/S8 couple different inputs to the gates of common source transistors 510 and 511. Vpbias2 turns transistors 510 and 511 on, but no signal is applied at the inputs. Switches S6/S8 couple input signals Si+ and Si− to the inputs of transistors 510 and 511.

Additionally, this example includes a second summing stage 1201 configured in parallel with the first summing stage (e.g., transistors 601-604). Summing stage 1201 may be selectively enabled and disabled (turned on and off) when the amplifier is in different operational configurations. In this example, summing stage 1201 includes PMOS transistors 601b-602b and NMOS transistors 603b-604b. Switches S9 and S10 are coupled to the gates of PMOS transistors 601b and 602b and switches S11 and S12 are coupled to the gates of NMOS transistors 603b and 604b. Switches S9-S12 coupled different bias voltages to the second summing stage 1201 to turn summing stage 1201 on and off in different configurations. For example, Vdd turns transistors 601b and 602b off, whereas Vpbias turns transistors 601b and 602b on and may set the current approximately equal to the current in transistors 601-602, for example. Likewise, Gnd turns transistors 603b and 604b off, whereas Vnbias turns transistors 603b and 604b on and may set the current approximately equal to the current in transistors 603 and 604, for example.

In some applications it may be desirable to have an amplifier operating in common source mode some of the time, in common gate mode other times, and in a common gate mode with noise cancellation in yet other times. Accordingly, in some aspect of the present disclosures, the circuit in FIG. 12 may be reconfigured into different modes. For example, in a first common gate mode, the first and second common gate stages (e.g., transistors 501-504) are active (on) and the first and second common source transistors (e.g., transistors 510-511) are inactive (off). This may be achieved by closing switches S1, S3, S5, and S7 and opening switches S2, S4, S6, and S8, for example. In a second common source mode, the first and second common source transistors 510-511 are on and the first and second common gate stages are off. In this case, switches S2, S4, S6, and S8 are closed and switches S1, S3, S5, and S7 are open. In a third common gate mode with noise cancellation, the first and second common gate stages and the first and second common source transistors are on. In this case, switches S1, S3, S6, and S8 are closed, and switches S2, S4, S5, and S7 are opened.

Similarly, summing stage 1201 may be selectively turned on and off during different modes of operation. In this example aspect of the present disclosure, the summing stage 1201 may be active (on) in common source mode to provide a path for current that may otherwise flow in the common gate stages when the common gate stages are turned off. Thus, in common source mode, switches S10 and S12 are closed and switches S9 and S11 are opened. In common gate mode and common gate mode with noise cancellation, S9 and S11 are closed and S10 and S12 are opened, thereby inactivating (or turning off) summing stage 1201. In another aspect of the present disclosure, transistors 601-604 may be sized large enough to handle the additional current from the common gate stage when the common gate stage is inactive and switches S9-S12 may be omitted.

While some of the above circuits illustrate examples of NMOS cross coupled transistors and PMOS transistors having gates that are coupled through capacitive attenuators, it is to be understood that other designs may have PMOS cross coupled transistors and NMOS transistors having gates coupled through capacitive attenuators (i.e., the circuit device types and polarity may be "flipped") as is well understood by those skilled in the art in light of the present disclosure.

The above description illustrates various aspects of the present disclosures of the present disclosure along with examples of how some aspects of the present disclosures may be implemented. The above examples should not be deemed to be the only aspect of the present disclosures, and are presented to illustrate the flexibility and advantages of aspects of the present disclosures as defined by the following claims. For example, while certain circuits above are illustrated using PMOS and NMOS, it is to be understood that other transistor types could be used. Based on the above disclosure and the following claims, other arrangements, aspect of the present disclosures, implementations and equivalents may be employed without departing from the scope of the present disclosure as defined by the claims.

Figure 13:
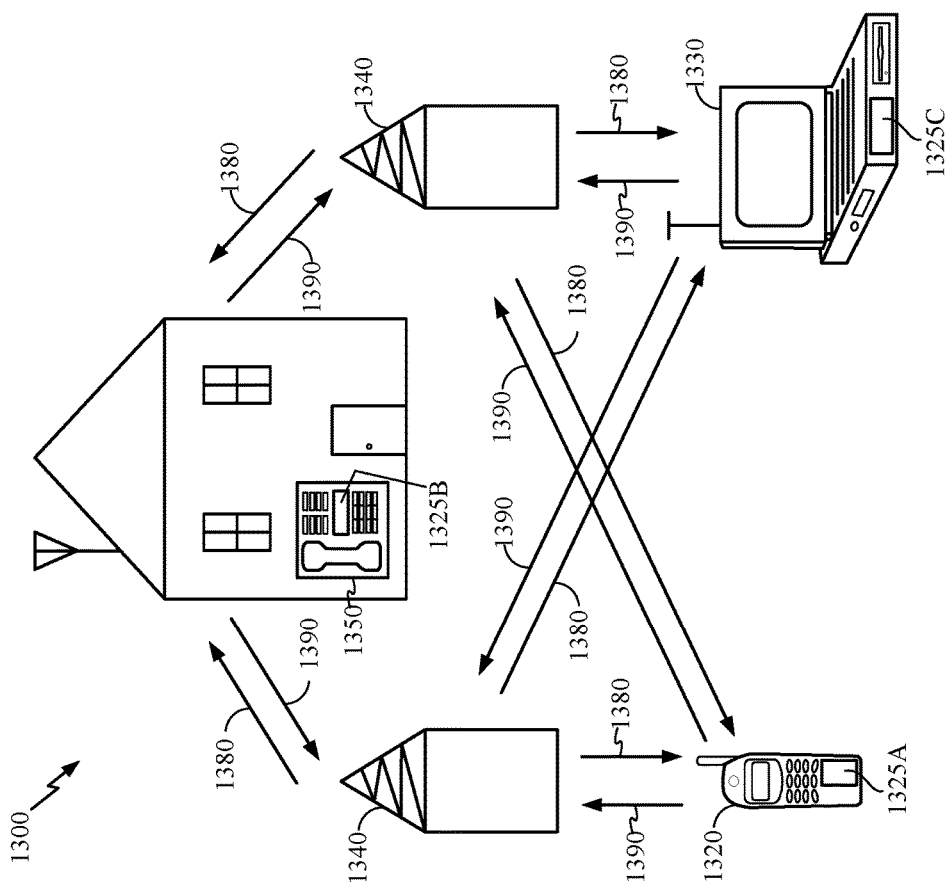
FIG. 13 is a block diagram showing an exemplary wireless communication system in which an aspect of the present disclosure may be advantageously employed.

FIG. 13 is a block diagram showing an exemplary wireless communication system 1300 in which an aspect of the present disclosure may be advantageously employed. For purposes of illustration, FIG. 13 shows three remote units 1320, 1330, and 1350 and two base stations 1340. It is recognized that wireless communication systems may have many more remote units and base stations. Remote units 1320, 1330, and 1350 include IC devices 1325A, 1325C, and 1325B that include the disclosed circuit (e.g., amplifier circuit). It is recognized that other devices may also include the disclosed circuit, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base station 1340.

In FIG. 13, remote unit 1320 is shown as a mobile telephone, remote unit 1330 is shown as a portable computer, and remote unit 1350 is shown as a fixed location remote unit in a wireless local loop system. For example, a remote units may be a mobile phone, user equipment, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 13 illustrates remote units according to the aspects of the present disclosure, the disclosure is not limited to these exemplary illustrated units. Aspects of the present disclosure may be suitably employed in many devices, which include the disclosed circuit.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A circuit comprising:
   a first common gate transistor having a first terminal, a second terminal, and a control terminal, wherein the first terminal is configured to receive an input signal, and the first common gate transistor having a first polarity;
   a second common gate transistor having a first terminal, a second terminal, and a control terminal, wherein the first terminal of the second common gate transistor is coupled to the first terminal of the first common gate transistor and configured to receive the input signal, the second common gate transistor having a second polarity; and
   a first current summing stage having a current summing transistor, a gate of the current summing transistor configured to receive an external bias voltage, a first terminal of the first current summing stage coupled to the second terminal of the first common gate transistor, a second terminal coupled to the second terminal of the second common gate transistor, and a first output terminal configured to generate a first output voltage based at least in part on combined currents from the first common gate transistor and the second common gate transistor.

2. The circuit of claim 1 further comprising a first common source transistor having a first terminal, a second terminal, and a control terminal, wherein the control terminal of the first common source transistor is configured to receive an inverse of the input signal and the second terminal is coupled to a second terminal of one of the first common gate transistor or the second common gate transistor.

3. The circuit of claim 2 wherein the first common source transistor is configured to conduct a bias current, wherein the second terminal of the first common gate transistor receives a first portion of the bias current and the first terminal of the first current summing stage receives the second portion of the bias current, and wherein the first portion of the bias current is greater than the second portion of the bias current.

4. The circuit of claim 2 wherein the first common gate transistor is at least two times greater in size than a first transistor in the first current summing stage.

5. The circuit of claim 1, the first current summing stage comprising:
   a first cascode transistor having a first terminal, a second terminal, and a control terminal, wherein the first terminal of the first cascode transistor is coupled to the second terminal of the first common gate transistor; and
   a second cascode transistor having a first terminal, a second terminal, and a control terminal, wherein the first terminal of the second cascode transistor is coupled to the second terminal of the second common gate transistor.

6. The circuit of claim 1, wherein the input signal is a first component of a differential signal, the circuit further comprising:
   a third common gate transistor having a first terminal, a second terminal, and a control terminal, wherein the first terminal is configured to receive a second component of the differential signal, the third common gate transistor having the first polarity; and
   a fourth common gate transistor having a first terminal, a second terminal, and a control terminal, wherein the first terminal of the fourth common gate transistor is coupled to the first terminal of the third common gate transistor and configured to receive the second component of the differential signal, the fourth common gate transistor having the second polarity,
   wherein the first output voltage of the first current summing stage is the first component of a differential output signal, wherein the first current summing stage further comprises a third terminal coupled to the second terminal of the third common gate transistor, a fourth terminal coupled to the second terminal of the fourth common gate transistor, and a second output terminal configured to generate a second output voltage based at least in part on combined currents from the third common gate transistor and the fourth common gate transistor, wherein the second output voltage is the second component of the differential output signal.

7. The circuit of claim 6, further comprising:
   a first common source transistor having a first terminal, a second terminal, and a control terminal, wherein the control terminal of the first common source transistor is configured to receive the second component of the differential signal, and the second terminal is coupled to the second terminal of one of the first common gate transistor or the second common gate transistor; and
   a second common source transistor having a first terminal, a second terminal, and a control terminal, wherein the control terminal of the second common source transistor is configured to receive the first component of the differential signal and the second terminal is coupled to the second terminal of one of the third common gate transistor or the fourth common gate transistor.

8. The circuit of claim 7, wherein the second terminal of the first common source transistor is coupled to the second terminal of the first common gate transistor and the second terminal of the second common source transistor is coupled to the second terminal of the third common gate transistor.

9. The circuit of claim 8, further comprising:
   a third common source transistor having a first terminal, a second terminal, and a control terminal, wherein the control terminal of the third common source transistor is configured to receive the second component of the differential signal, and the second terminal is coupled to the second terminal of the second common gate transistor; and
   a fourth common source transistor having a first terminal, a second terminal, and a control terminal, wherein the control terminal of the fourth common source transistor is configured to receive the first component of the differential signal and the second terminal is coupled to the second terminal of the fourth common gate transistor.

10. The circuit of claim 7, wherein the second terminal of the first common source transistor is coupled to the second terminal of the second common gate transistor and the second terminal of the second common source transistor is coupled to the second terminal of the fourth common gate transistor.

11. The circuit of claim 7, further comprising:
a third common source transistor having a first terminal, a second terminal, and a control terminal, wherein the control terminal of the third common source transistor is configured to receive the second component of the differential signal and the second terminal is coupled to the second terminal of the first common source transistor; and
a fourth common source transistor having a first terminal, a second terminal, and a control terminal, wherein the control terminal of the fourth common source transistor is configured to receive the first component of the differential signal and the second terminal is coupled to the second terminal of the third common source transistor.

12. The circuit of claim 11, wherein, in a first mode, the first common gate transistor, the second common gate transistor, the third common gate transistor, and the fourth common gate transistor are configured to be off and the third common source transistor and the fourth common source transistor are configured to be on, and in a second mode, the first common gate transistor, the second common gate transistor, the third common gate transistor, and the fourth common gate transistor are configured to be on and the third common source transistor and the fourth common source transistor are configured to be off.

13. The circuit of claim 7, further comprising:
a first plurality of switches coupled to the first common gate transistor and the second common gate transistor; and
a second plurality of switches coupled to the first common source transistor and the second common source transistor,
wherein, in a first mode, the first common gate transistor and the second common gate transistor are configured to be on and the first common source transistor and the second common source transistor are configured to be off, in a second mode, the first common source transistor and the second common source transistor are configured to be on and the first common gate transistor and the second common gate transistor are configured to be off, and in a third mode, the first common gate transistor and the second common gate transistor and the first common source transistor and the second common source transistor are configured to be on.

14. The circuit of claim 13, further comprising:
a second current summing stage; and
a third plurality of switches,
wherein in the first mode and the third mode, the third plurality of switches are operable to turn off the second current summing stage, and in the second mode, the third plurality of switches are operable to turn on the second current summing stage.

15. The circuit of claim 1, wherein the circuit is configured in a wireless receiver channel.

16. The circuit of claim 1, wherein the circuit is configured in a wireless transmitter channel.

17. The circuit of claim 1, wherein the first terminal of the first common gate transistor and the first terminal of the second common gate transistor are coupled to an output of a mixer.

18. The circuit of claim 1, wherein the first terminal of the first common gate transistor and the first terminal of the second common gate transistor are coupled to an output of a digital to analog converter.

19. A circuit comprising:
a common gate transistor having a first terminal, a second terminal, and a control terminal, wherein the first terminal of the common gate transistor is configured to receive an input signal;
a common source transistor having a first terminal, a second terminal, and a control terminal, wherein the control terminal of the common source transistor is configured to receive an inverse of the input signal, and the first terminal is configured to receive a bias current; and
a cascode transistor having a first terminal, a second terminal, and a control terminal, wherein the first terminal of the cascode transistor is coupled to a node, and wherein the node is coupled to the second terminal of the common source transistor, and the second terminal of the common gate transistor, and wherein the control terminal of the cascode transistor is configured to receive an external bias voltage, wherein the second terminal of the common gate transistor is configured to receive a first portion of the bias current from the second terminal of the common source transistor, and the first terminal of the cascode transistor is configured to receive a second portion of the bias current from the second terminal of the common source transistor, and wherein the first portion of the bias current is configured to be greater than the second portion of the bias current.

20. The circuit of claim 19, wherein the common source transistor is a first polarity and the common gate transistor is a second polarity opposite the first polarity.

21. The circuit of claim 19, wherein the second terminal of the cascode transistor is coupled to the first terminal of the common gate transistor to re-combine the first and second portions of the bias current.

22. A circuit comprising:
a first transistor of a first transistor polarity having a gate, a source, and a drain, wherein the source is configured to receive a first component of a differential input signal;
a second transistor of a second transistor polarity having a gate, a source, and a drain, wherein the source of the second transistor is coupled to the source of the first transistor to receive the first component of the differential input signal;
a third transistor of the first transistor polarity having a gate, a source, and a drain, wherein the source is configured to receive a second component of the differential input signal;
a fourth transistor of the second transistor polarity having a gate, a source, and a drain, wherein the source of the fourth transistor is coupled to the source of the third transistor to receive the second component of the differential input signal;
a fifth transistor of the second transistor polarity having a gate, a source, and a drain, wherein the drain of the fifth transistor is coupled to the drain of the first transistor and the gate of the fifth transistor is configured to receive the second component of the differential input signal;
a sixth transistor of the second transistor polarity having a gate, a source, and a drain, wherein the drain of the sixth transistor is coupled to the drain of the third transistor and the gate of the sixth transistor is configured to receive the first component of the differential input signal; and
a current summing stage between the drains of the first transistor and the third transistor and the drains of the second transistor and the fourth transistor, the current summing stage having a current summing transistor, a gate of the current summing transistor configured to receive an external bias voltage.

23. The circuit of claim 22 wherein the first transistor polarity is N-type and the second transistor polarity is P-type.

24. The circuit of claim 22, the current summing stage comprising:
- a first cascode transistor of the second transistor polarity having a gate, a source, and a drain, wherein the source is coupled to the drain of the fifth transistor and the drain of the first transistor;
- a second cascode transistor of the second transistor polarity having a gate, a source, and a drain, wherein the source is coupled to the drain of the sixth transistor and the drain of the third transistor;
- a third cascode transistor of the first transistor polarity having a gate, a source, and a drain, wherein the source is coupled to the drain of the second transistor; and
- a fourth cascode transistor of the first transistor polarity having a gate, a source, and a drain, wherein the source is coupled to the drain of the fourth transistor.

\* \* \* \* \*